United States Patent
Arai et al.

(10) Patent No.: US 7,195,996 B2
(45) Date of Patent: Mar. 27, 2007

(54) METHOD OF MANUFACTURING SILICON CARBIDE SEMICONDUCTOR DEVICE

(75) Inventors: Manabu Arai, Kamifukuoka (JP); Hiroshi Sawazaki, Kamifukuoka (JP)

(73) Assignee: New Japan Radio Co., Ltd., Tokyo-To (JP)

( * ) Notice: Subject to any disclaimer, the term of this patent is extended or adjusted under 35 U.S.C. 154(b) by 38 days.

(21) Appl. No.: 11/199,140

(22) Filed: Aug. 9, 2005

(65) Prior Publication Data
US 2007/0037369 A1    Feb. 15, 2007

(51) Int. Cl.
*H01L 21/28* (2006.01)
(52) U.S. Cl. ............... 438/570; 438/571; 257/E29.271; 257/E27.068
(58) Field of Classification Search ........ 438/570, 438/571; 257/E29.271, E27.068
See application file for complete search history.

(56) References Cited

U.S. PATENT DOCUMENTS
2005/0205892 A1*   9/2005  Yanagihara et al. ........ 257/184

FOREIGN PATENT DOCUMENTS
JP       164525/2000       6/2000

\* cited by examiner

*Primary Examiner*—Long Tran
(74) *Attorney, Agent, or Firm*—Antonelli, Terry, Stout and Kraus, LLP.

(57) ABSTRACT

A manufacturing method for forming a region into which impurity ions are implanted, and an electrode is coupled to the region, in a self-aligned manner. An oxide film is formed on an n-type semiconductor layer composed of a silicon carbide semiconductor, and then the oxide film on regions in which source and drain regions are to be formed is removed by etching. Impurity ions are implanted into an exposed semiconductor layer and heat treatment is performed for activating the implanted impurity ions. A metal film to serve as ohmic electrodes is formed on the entire surface, and then the oxide film is removed by etching to thereby form a source electrode and a drain electrode. Leaving a part of the oxide film on regions on which source and drain electrodes are to be formed can prevent the oxide film from being deformed during the heat treatment for activation.

2 Claims, 3 Drawing Sheets

METHOD OF MANUFACTURING SILICON CARBIDE SEMICONDUCTOR DEVICE

BACKGROUND OF THE INVENTION

The present invention relates to methods for manufacturing a silicon carbide semiconductor device, and particularly to a manufacturing method of implanting impurity ions into a silicon carbide semiconductor layer to self-alignedly form an ohmic electrode on the implanted region.

Silicon carbide (hereinafter, also referred to as SiC) which is one of the semiconductors having a wide band gap, has the band gap of 3.26 eV (in the case of 4H—SiC), which is larger than that of silicon (Si) by about three times. Additionally, SiC has a breakdown field, larger than that of Si by about ten times, an electron saturation velocity of $2 \times 10^7$ cm/s, larger than that of Si by about two times, and a thermal conductivity of 4.9 W/cm.K, larger than that of Si by about three times. Therefore, semiconductor devices employing SiC are expected to achieve high breakdown voltage, low loss, high output, and high efficiency, and thus have been on a focus of attention in recent years.

When forming a semiconductor device composed of SiC, an epitaxial layer is typically used. This is because a method of diffusing impurities from a gas phase, typically used in a manufacturing step of a Si semiconductor device, cannot be employed since an impurity diffusion coefficient of SiC is small. Meanwhile, for ion implantation methods, researches on impurities to be added and heat treatment temperatures have not yet progressed sufficiently.

As an example of conventional SiC semiconductor devices, a manufacturing method of a field effect transistor using an epitaxial layer will be explained. Referring to FIGS. 5a to 5d, first, a semiconductor substrate is prepared by epitaxially growing an n-type channel layer 2 and an n-type heavily doped layer 3 doped with a high-concentration impurity on a silicon carbide semi-insulating substrate 1 sequentially (FIG. 5a). In order to ensure an electrical isolation between neighboring field effect transistors, the n-type heavily doped layer 3 and the n-type channel layer 2 except for those in a region in which a field effect transistor is to be formed are removed by dry etching, to thereby expose the substrate 1 (FIG. 5b). The n-type heavily doped layer 3 except for that in regions on which source and drain electrodes are to be formed is then removed by dry etching (FIG. 5c). A metal film that forms an ohmic contact is formed on the regions on which source and drain electrodes are to be formed while using typical photolithography, heat treatment will be performed if necessary, and a source electrode 4 and a drain electrode 5 are formed. Finally, a gate electrode 6 that forms a schottky contact with the n-type channel layer 2 is formed, completing a silicon carbide field effect transistor (FIG. 5d).

Further, a method of forming the n-type heavily doped layer 3 by means of implanting impurity ions into the layer, instead of epitaxially growing the layer is disclosed (see, Japanese Unexamined Patent Publication No. 175239/1993). When implanting impurity ions into a silicon carbide semiconductor to form a heavily doped region, high temperature heat treatment referred to as activation anneal is needed to activate the implanted impurity ions. When activating, for example nitrogen ions implanted into SiC, heat treatment at 1200° C. is required (Japanese Unexamined Patent Publication No. 164525/2000).

SUMMARY OF THE INVENTION

Generally, in an epitaxial growth method, the growth thickness and impurity concentration of the n-type heavily doped layer 3 and the n-type channel layer 2 vary across the substrate surface. In addition to that, the above-described manufacturing method cannot form a gate electrode directly on the n-type heavily doped layer 3, so that the n-type heavily doped layer 3 needs to be completely removed. In this case, the surface of the n-type channel layer 2, on which the gate electrode is formed, is also etched. As a result, the amount of etching as well as the epitaxial growth thickness varies across the substrate surface. There has been a problem that variation of current value of the field effect transistor has been increased due to the thickness variation of the n-type channel layer 2 left under the gate electrode 6.

In the case of using an ion implantation method to form a heavily doped region, heat treatment at about 1200° C. has been required to activate the implanted impurity ions, resulting in the need to remove such as an oxide film, photoresist that are used as a mask film when implanting the impurity ions. Therefore, when forming source and drain electrodes that contact with the heavily doped region, a technique for highly accurate alignment has been needed, and defects due to misalignment have often been caused.

The source and gate electrodes have needed to be formed as close as possible to each other in order to improve the high frequency characteristics of the field effect transistor, so that the misalignment not only has increased variation of electrical characteristics but also caused a problem of a short circuit between the source and gate electrodes.

In order to address and solve the problems, the present invention is intended to provide a manufacturing method that can self-alignedly form a region into which impurity ions are implanted and an electrode coupled to the region.

In order to achieve the object described above, a manufacturing method according to a first aspect of the present invention includes: preparing a semiconductor layer of one conductivity type comprising a silicon carbide semiconductor; forming an oxide film on the semiconductor layer of the one conductivity type; removing a part of the oxide film to expose the semiconductor layer of the one conductivity type; implanting impurity ions into the exposed semiconductor layer, performing heat treatment for activating the impurity ion, and forming a semiconductor region of the one conductivity type, the semiconductor region having impurity concentration higher than that of the semiconductor layer; covering a surface of the oxide film and a surface of the semiconductor region with a metal film that forms ohmic contact with the semiconductor region; and removing the oxide film by etching to remove the metal film on the oxide film, selectively leaving the metal film on the semiconductor region, and forming an electrode that forms an ohmic contact with the semiconductor region.

A manufacturing method according to a second aspect of the present invention includes: preparing a semiconductor layer of one conductivity type comprising a silicon carbide semiconductor layer; forming an oxide film on the semiconductor layer of the one conductivity type; removing a part of the oxide film to form a recess on regions on which ohmic electrodes are to be formed, the regions being separated from each other at a certain interval; implanting impurity ions into the semiconductor layer of the one conductivity type through the oxide film in the recess, performing heat treatment for activating the impurity ion, and forming a semiconductor region of the one conductivity type, the semiconductor region having an impurity concentration higher than that of the semiconductor layer; removing the oxide film left in the recess to expose the semiconductor region; covering a surface of the oxide film and a surface of the semiconductor region with a metal film that forms ohmic contact with the semiconductor region; removing the oxide film by etching to remove the metal film on the oxide film, selectively leaving the metal film on the semiconductor region, and forming an electrode; and forming a schottky electrode, which forms schottky contact with the semiconductor layer, on the semiconductor layer between the ohmic electrodes.

According to the aspects of the present invention, the region into which impurity ions are implanted and the electrode coupled to the region are self-alignedly formed, so that no misalignment is caused, thereby making it possible to manufacture the semiconductor device with little variation of electrical characteristics.

Particularly, when applying the aspects of the present invention to form a high frequency field effect transistor, source and drain electrodes can be formed to have a narrow gap therebetween, improving the high frequency characteristic. In addition, a source region and a source electrode coupled to the source region can be self-alignedly formed, so that even when a gate electrode is formed close to the source electrode, a short circuit between the gate electrode and the source region is not caused, leading to an advantage of achieving a high manufacturing yield.

DETAILED DESCRIPTION

Hereinafter, Embodiments of the present invention will be described in detail by taking a manufacturing method of a field effect transistor as an example.

Embodiment 1

Figure 1A:
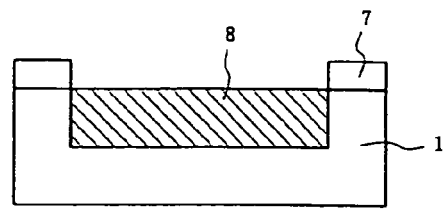
FIG. 1 is a diagram for illustrating a first Embodiment of the present invention.

A first Embodiment of the present invention will be described referring to FIGS. 1a to 1e and 2. First, photoresist 7 is patterned on a surface of a semi-insulating SiC substrate 1 to open a region in which a field effect transistor is to be formed. In order to form an n-type channel layer, implantation of nitrogen ions into the opening is then repeated six times under the following respective six conditions of acceleration voltage and dose amount: 170 eV and $2.8 \times 10^{12}$ atom/cm$^2$; 125 eV and $1.8 \times 10^{12}$ atom/cm$^2$; 90 eV and $1.5 \times 10^{12}$ atom/cm$^2$; 60 eV and $1.2 \times 10^{12}$ atom/cm$^2$; 40 eV and $9.0 \times 10^{11}$ atom/cm$^2$; and 25 eV and $6.0 \times 10^{11}$ atom/cm$^2$. As a result, a channel region 8 with the depth of 300 nm and the impurity concentration of $3 \times 10^{17}$ atom/cm$^3$ is formed (FIG. 1a).

Figure 1B:
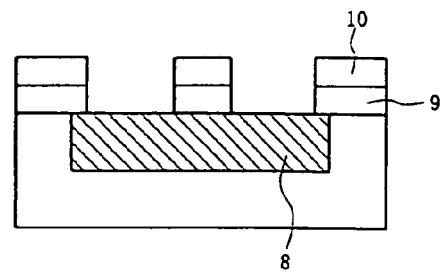

After the photoresist 7 is removed, a silicon oxide film 9 is formed on the entire surface. The silicon oxide film 9 can be formed by chemical vapor deposition or sputtering. The silicon oxide film 9 is formed to have a thickness larger than that of a metal film, as will be described later, for forming ohmic electrodes. Subsequently, in order to form source and drain regions, another photoresist 10 is patterned on the surface of the silicon oxide film 9 to open regions in which source and drain regions are to be formed. The silicon oxide film 9 is removed by etching while using the photoresist 10 as an etch mask, and thus the channel layer 8 in the regions in which source and drain regions are to be formed is exposed (FIG. 1b).

Figure 1C:
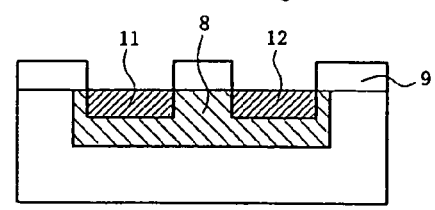

After the photoresist 10 is removed, in order to form heavily doped n-type source and drain regions, implantation of phosphorous ions into the exposed channel layer 8 is repeated three times, while using the silicon oxide film 9 as an implantation mask, under the following respective three conditions of acceleration voltage and dose amount: 120 eV and $2.0 \times 10^{15}$ atom/cm$^2$; 70 eV and $1.0 \times 10^{15}$ atom/cm$^2$; and 40 eV and $5.0 \times 10^{14}$ atom/cm$^2$. Thereafter, heat treatment is performed to activate the implanted impurity ions, however, in the Embodiment, the heat treatment is performed without removing the silicon oxide film 9. The heat treatment is performed in an inert gas atmosphere such as an argon gas atmosphere under the atmospheric pressure, at 1350° C. for 30 minutes. This heat treatment can recover the crystallinity of the ion-implanted layer and activate the impurity ions, so that a source region 11 and a drain region 12 are formed (FIG. 1c). Note that the heat treatment for activation needs to be performed at a temperature in the range of 1250–1350° C. This is because temperatures under 1250° C. cannot achieve sufficient activation, and temperatures above 1350° C. induce silicon to sublime from the SiC surface, which roughens the surface, and cause deformation of the sectional shape of the silicon oxide film 9, precluding the formation of a metal film to be described later.

Figure 1D:
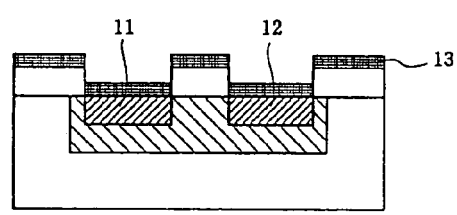
Figure 1E:
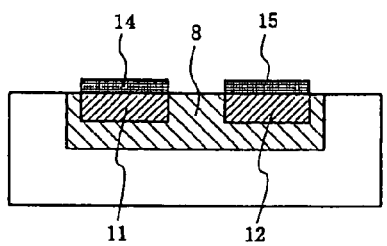

Subsequently, the entire surface is covered with a metal film 13 that forms ohmic contact with the heavily doped n-type source and drain regions 11 and 12 (FIG. 1d). A nickel film is used as the metal film, for example. Since the thickness of the silicon oxide film 9 is larger than that of the metal film 13, the metal film 13 on the silicon oxide film 9 is separated from the metal film 13 on the source and drain regions 11 and 12. Under such condition, the silicon oxide film 9 is removed by using a fluorinated acid liquid, which is an etchant that does not etch the nickel film but etches the silicon oxide film 9. As a result, the metal film 13 on the silicon oxide film 9 is removed, and thus the metal film 13 is selectively left on the source and drain regions 11 and 12. Thereafter, heat treatment is performed in an inert gas atmosphere under the atmospheric pressure at 1000° C. for 2 minutes, to form a source electrode 14 and a drain electrode 15 that form ohmic contact with the source and drain regions 11 and 12, respectively (FIG. 1e).

As described above, the silicon oxide film 9 is used as an implantation mask film for forming the source and drain regions, while being used as a mask film for so-called lift-off for forming the source and drain electrodes 14 and 15, so that the source region 11 and the source electrode 14, and the drain region 12 and the drain electrode 15 can be self-alignedly formed, eliminating misalignment. In addition, since the impurity ions implanted into SiC have a small diffusion coefficient, the source and drain regions can be formed substantially in keeping with the source and drain electrodes, respectively.

Figure 2:
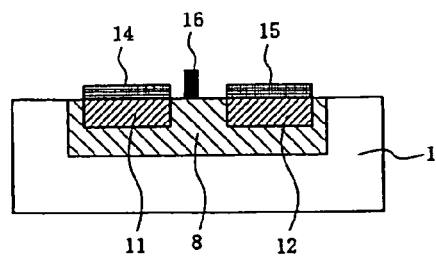
FIG. 2 is a diagram for illustrating an Embodiment of the present invention.

Finally, a gate electrode 16 for controlling a current flowing through the channel layer 8 is formed between the source and drain electrodes 14 and 15 (FIG. 2). Subsequently, a surface protective film and the like are formed to complete a field effect transistor through typical manufacturing steps of the field effect transistor.

Embodiment 2

A second Embodiment of the present invention will now be described below. In order to improve the high frequency characteristics of the field effect transistor of the first Embodiment, if the source and drain electrodes are disposed close to each other to have a gap of about 2 micrometers therebetween, the silicon oxide film 9 may be deformed during heat treatment for activation. The second Embodiment, which is adequate for manufacturing a semiconductor device that needs to be miniaturized, such as a high frequency field effect transistor, will be then explained below.

First, similarly to the first Embodiment, the photoresist 7 is patterned on the surface of the semi-insulating SiC substrate 1 to open a region in which a field effect transistor is to be formed. Then, in order to form an n-type channel layer, implantation of nitrogen ions into the opening is repeated six times under the following respective six conditions of acceleration voltage and dose amount: 170 eV and $2.8 \times 10^{12}$ atom/cm$^2$; 125 eV and $1.8 \times 10^{12}$ atom/cm$^2$; 90 eV and $1.5 \times 10^{12}$ atom/cm$^2$; 60 eV and $1.2 \times 10^{12}$ atom/cm$^2$; 40 eV and $9.0 \times 10^{11}$ atom/cm$^2$; and 25 eV and $6.0 \times 10^{11}$ atom/cm$^2$. As a result, the channel region 8 with the depth of 300 nm and the impurity concentration of $3 \times 10^{17}$ atom/cm$^3$ is formed (FIG. 1a).

Figure 3A:
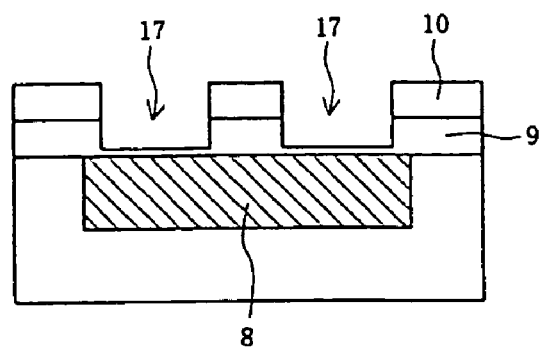
FIG. 3 is a diagram for illustrating a second Embodiment of the present invention.

After the photoresist 7 is removed, the silicon oxide film 9 is formed on the entire surface. The silicon oxide film 9 can be formed by chemical vapor deposition or sputtering. Subsequently, in order to form source and drain regions, another photoresist 10 is patterned on the surface of the silicon oxide film 9 to open regions in which source and drain regions are to be formed. Then, a part of the silicon oxide film 9 is removed by etching while using the photoresist 10 as an etch mask, to form recesses 17 by leaving the silicon oxide film 9 with a slight thickness on the regions in which source and drain regions are to be formed (FIG. 3a). Leaving the silicon oxide film 9 at the bottom of the recesses 17 in this manner prevents the sectional shape of the silicon oxide film 9 from being deformed during high temperature heat treatment. Therefore, a part of the silicon oxide film 9 is left to form the recesses 17 in the present Embodiment, in order to prevent deformation of the sectional shape of the silicon oxide film 9 during heat treatment for activating impurity ions that are implanted to form source and drain regions to be described later. Although the thickness of the silicon oxide film 9 left at the bottom of the recesses 17 may adequately be defined, the inventors have confirmed that, when the gap between the recesses 17 has been about 2 micrometers, leaving the silicon oxide film 9 with a thickness of about 50 nm has resulted in no problem even when heat treatment at 1350° C. for about 30 minutes has been performed.

Figure 3B:
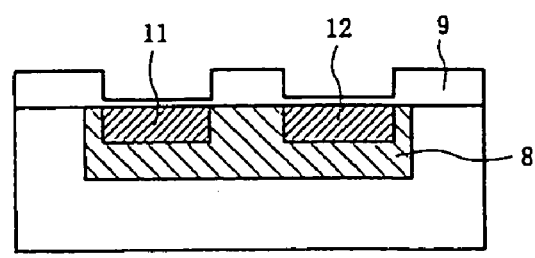

After the photoresist 10 is removed, in order to form heavily doped n-type source and drain regions, implantation of phosphorous ions into the channel layer 8 though the silicon oxide film 9 left in the recesses 17 is repeated three times under the following respective three conditions of acceleration voltage and dose amount: 120 eV and $2.0 \times 10^{15}$ atom/cm$^2$; 70 eV and $1.0 \times 10^{15}$ atom/cm$^2$; and 40 eV and $5.0 \times 10^{14}$ atom/cm$^2$. Thereafter, heat treatment is performed to activate the implanted impurity ions. The heat treatment is performed in an inert gas atmosphere (for example an argon gas atmosphere) at 1350° C. for 30 minutes under the atmospheric pressure. This heat treatment can recover the crystallinity of the ion-implanted layer and activate the impurity ions to thereby form the source and drain regions 11 and 12 (FIG. 3b). Note that the heat treatment for activation needs to be performed at a temperature in the range of 1250–1350° C. Implanting impurity ions through the slightly left silicon oxide film 9 also provides an advantage that higher impurity concentration at the surfaces of the regions 11 and 12 can be achieved compared with the case of implanting impurity ions when exposing the surface of the channel layer 8.

Figure 3C:
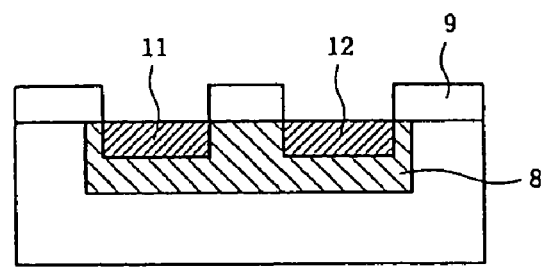

The silicon oxide film 9 left at the bottom of the recesses 17 is removed to expose the source and drain regions 11 and 12 (FIG. 3c). As explained in the first Embodiment, the entire surface is then covered with the metal film 13 that forms ohmic contact with the heavily doped n-type source and drain regions 11 and 12 (FIG. 1d). A nickel film is used as the metal film, for example. The silicon oxide film 9 is removed by using a fluorinated acid liquid, which is an etchant that does not etch the nickel film but etches the silicon oxide film 9. As a result, the metal film 13 on the silicon oxide film 9 is removed, and thus the metal film 13 is selectively left on the source and drain electrodes 11 and 12. Thereafter, heat treatment is performed in an inert gas atmosphere under the atmospheric pressure at 1000° C. for 2 minutes, to form the source and drain electrodes 14 and 15 that form ohmic contact with the source and drain regions 11 and 12, respectively (FIG. 1e). In the present Embodiment, the impurity concentration at the surfaces of the source and drain regions 11 and 12 is high, and therefore good ohmic electrodes providing low contact resistance can be formed.

As described above, also in the present Embodiment, the silicon oxide film 9 is used as an implantation mask film, while being used as a mask film to form the source and drain electrodes 14 and 15, so that the source region 11 and the source electrode 14, and the drain region 12 and the drain electrode 15 can be self-alignedly formed, eliminating misalignment. In addition, since the impurity ions implanted into SiC have a small diffusion coefficient, the source and drain regions can be formed substantially in keeping with the source and drain electrodes, respectively.

The gate electrode 16 for controlling a current flowing through the channel layer 8 is finally formed between the source and drain electrodes 14 and 15 (FIG. 2). Subsequently, a surface protective film and the like are formed to complete a field effect transistor through typical manufacturing steps for a field effect transistor.

In the field effect transistor formed in this way, the contact resistance of the source and drain electrodes is low, so that the field effect transistor has a higher current driving ability, thereby an advantage of enhancing operation speed for high frequency device characteristics is achieved.

Figure 4:
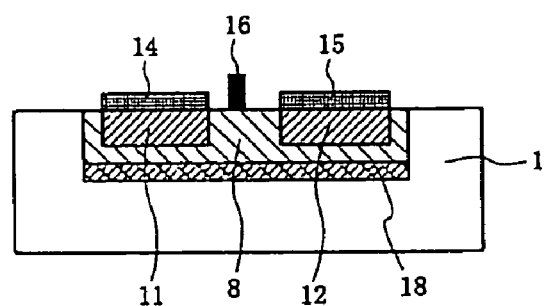
FIG. 4 is a diagram for illustrating another Embodiment of the present invention.
Figure 5A:
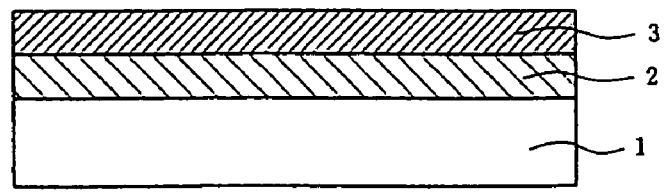
FIG. 5 is a diagram for illustrating a method of manufacturing a conventional semiconductor device.
Figure 5B:
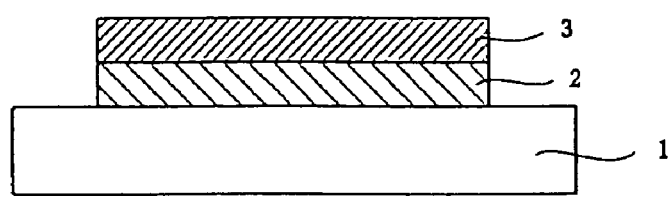
Figure 5C:
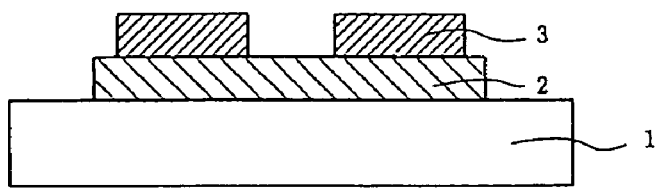
Figure 5D:
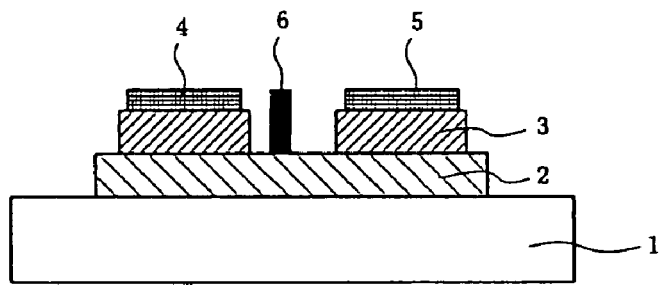

The Embodiments of the present invention have been explained above, but it should be noted that the present invention is not limited to the above-described Embodiments. As shown in, for example FIG. 4, a p-type layer 18 may be formed under the channel layer 8. The p-type layer 18 can be formed by implanting aluminum or boron ions prior to implantation of impurity ions for forming the channel layer 8.

Further, an n-type or p-type substrate may be used instead of the semi-insulating substrate 1. In this case, it is obvious that a conductive region necessary to insulate the channel layer needs to be formed. Furthermore, an epitaxially grown layer may be formed on the SiC substrate, and then the above-described channel layer and the like may be formed in the epitaxially grown layer.

What is claimed is:

1. A method of manufacturing a silicon carbide semiconductor device, comprising the steps of:
preparing a semiconductor layer of one conductivity type comprising a silicon carbide semiconductor;
forming an oxide film on the semiconductor layer of the one conductivity type;
removing a part of the oxide film to expose the semiconductor layer of the one conductivity type;
implanting impurity ions into the exposed semiconductor layer, performing heat treatment for activating the impurity ion, and forming a semiconductor region of the one conductivity type, the semiconductor region having impurity concentration higher than that of the semiconductor layer;
covering a surface of the oxide film and a surface of the semiconductor region with a metal film that forms ohmic contact with the semiconductor region; and
removing the oxide film by etching to remove the metal film on the oxide film, selectively leaving the metal film on the semiconductor region, and forming an electrode that forms an ohmic contact with the semiconductor region.

2. A method of manufacturing a silicon carbide semiconductor device, comprising the steps of:
preparing a semiconductor layer of one conductivity type comprising a silicon carbide semiconductor layer;
forming an oxide film on the semiconductor layer of the one conductivity type;
removing a part of the oxide film to form a recess on regions on which ohmic electrodes are to be formed, the regions being separated from each other at a certain interval;
implanting impurity ions into the semiconductor layer of the one conductivity type through the oxide film in the recess, performing heat treatment for activating the impurity ion, and forming a semiconductor region of the one conductivity type, the semiconductor region having an impurity concentration higher than that of the semiconductor layer;
removing the oxide film left in the recess to expose the semiconductor region;
covering a surface of the oxide film and a surface of the semiconductor region with a metal film that forms ohmic contact with the semiconductor region;
removing the oxide film by etching to remove the metal film on the oxide film, selectively leaving the metal film on the semiconductor region, and forming an electrode; and
forming a schottky electrode, which forms schottky contact with the semiconductor layer, on the semiconductor layer between the ohmic electrodes.

* * * * *